United States Patent
Timm et al.

(10) Patent No.: US 9,152,902 B2
(45) Date of Patent: Oct. 6, 2015

(54) IDENTIFICATION DOCUMENT WITH A CONTACTLESS RFID CHIP

(75) Inventors: Volker Timm, Pinneberg (DE); Kim Nguyen, Berlin (DE)

(73) Assignee: NXP, B.V., Eindhoven (NL)

( * ) Notice: Subject to any disclaimer, the term of this patent is extended or adjusted under 35 U.S.C. 154(b) by 944 days.

(21) Appl. No.: 11/574,325

(22) PCT Filed: Aug. 30, 2005

(86) PCT No.: PCT/IB2005/052830
§ 371 (c)(1),
(2), (4) Date: Oct. 12, 2007

(87) PCT Pub. No.: WO2006/025017
PCT Pub. Date: Mar. 9, 2006

(65) Prior Publication Data
US 2008/0218308 A1 Sep. 11, 2008

(30) Foreign Application Priority Data
Sep. 2, 2004 (EP) .................................. 04104216

(51) Int. Cl.
*G05B 19/00* (2006.01)
*G06K 19/02* (2006.01)
*G06K 19/077* (2006.01)

(52) U.S. Cl.
CPC ........ *G06K 19/025* (2013.01); *G06K 19/07728* (2013.01); *G06K 19/07749* (2013.01); *H01L 2224/48091* (2013.01); *H01L 2224/48227* (2013.01)

(58) Field of Classification Search
CPC .......... G06K 19/07749; G06K 19/005; G06K 19/073; G06K 19/0723; G06K 19/07327; G06K 19/025; G06K 19/07728; B42D 2037/08; B42D 15/10; B42D 2033/46; A45C 2001/065; A45C 1/06
USPC ........ 340/500, 540, 568.1, 572.1, 572.8, 5.8, 340/5.81, 572.7; 257/679, 787; 235/375, 235/380, 492
See application file for complete search history.

(56) References Cited

U.S. PATENT DOCUMENTS

| | | | |
|---|---|---|---|
| 4,578,279 A * | 3/1986 | Zingher | 427/10 |
| 4,671,255 A * | 6/1987 | Dubrul et al. | 128/899 |
| 4,816,362 A * | 3/1989 | Takeda et al. | 430/14 |
| 5,319,475 A * | 6/1994 | Kay et al. | 359/2 |
| 5,528,222 A * | 6/1996 | Moskowitz et al. | 340/572.7 |
| 5,544,014 A | 8/1996 | Atsumi | |
| 5,898,370 A * | 4/1999 | Reymond | 340/540 |
| 6,008,993 A * | 12/1999 | Kreft | 361/737 |

(Continued)

FOREIGN PATENT DOCUMENTS

| | | |
|---|---|---|
| DE | 10054873 A1 | 5/2002 |
| JP | 2002031615 A | 1/2002 |

(Continued)

*Primary Examiner* — Brian Zimmerman
*Assistant Examiner* — An T Nguyen

(57) ABSTRACT

To provide an identification document, particularly a passport, in which at least one contactless RFID chip (10) and an antenna (12) connected thereto are integrated on a page of the identification document, an additional layer (22) mechanically reinforcing the RFID chip is situated at the area of the RFID chip (10) on the page, thus providing an arrangement with which the RFID chip can withstand mechanical stress for years on end.

6 Claims, 2 Drawing Sheets

(56) References Cited

U.S. PATENT DOCUMENTS

| | | | |
|---|---|---|---|
| 6,114,962 A * | 9/2000 | Wiklof et al. | 340/572.8 |
| 6,576,990 B2 * | 6/2003 | Flesher et al. | 257/679 |
| 6,784,837 B2 * | 8/2004 | Revankar et al. | 342/372 |
| 6,786,419 B2 * | 9/2004 | Kayanakis | 235/492 |
| 2003/0038174 A1 * | 2/2003 | Jones | 235/380 |
| 2003/0132302 A1 * | 7/2003 | Hattori | 235/492 |
| 2003/0178495 A1 | 9/2003 | Jones et al. | |
| 2003/0211246 A1 * | 11/2003 | Kydd et al. | 427/282 |
| 2004/0118930 A1 * | 6/2004 | Berardi et al. | 235/492 |
| 2004/0159961 A1 * | 8/2004 | Mensch et al. | 257/787 |
| 2005/0072849 A1 * | 4/2005 | Jones | 235/487 |
| 2008/0218308 A1 * | 9/2008 | Timm et al. | 340/5.8 |
| 2010/0148487 A1 * | 6/2010 | Trantoul et al. | 283/85 |

FOREIGN PATENT DOCUMENTS

| | | | | |
|---|---|---|---|---|
| JP | 2002216097 A | * | 8/2002 | G06K 19/077 |
| WO | 03058713 A2 | | 7/2003 | |

* cited by examiner

IDENTIFICATION DOCUMENT WITH A CONTACTLESS RFID CHIP

The invention relates to an identification document, particularly a passport, comprising a contactless RFID chip as defined in the pre-characterizing part of claim 1.

New generations of passports will have biometrical data stored on an RFID chip integrated in the document. Passport control, for example at a border crossing, may be performed by scanning the passport and reading the chip. It takes only a few seconds to read the chip and, consequently, leads to a very swift identification of the passport owner. In this respect, it is relevant how to manufacture a passport with an embedded chip and an antenna so as to withstand loads, such as stamping and folding, for a comparatively long period of time, for example, 10 years.

The robust design of chip cards such as, for example, multimedia cards or smart cards is known from the prior art. Such cards have a card body made of a synthetic material and incorporating a semiconductor chip.

U.S. Pat. No. 5,544,014 describes an arrangement of a microchip in a card body in which the microchip edges are tapered. It is achieved by the reducing thickness that the durability is enhanced, also under strong loads.

WO 03/058713 describes a mechanism of fixing a microchip on a chip carrier. An outer fixation edge of the chip carrier is reinforced by means of an additional layer. In a preferred embodiment, this reinforcement has an inner edge which does not extend linearly but is, for example, curved or serrated. The sensitivity to breakage is thereby reduced at the transition between the reinforced and the inner area of the chip carrier.

Moreover, the prior art discloses methods in which the stability of the connection between the different layers in the smart card is enhanced in that at least one layer is apertured. Such methods are known from, for example, JP2002 31615 and JP2002 216097.

US 2003/0,132,302 describes a contactless RFID memory card in which (when viewing the chip from the top) a small metal plate is provided behind the chip, which metal plate mechanically reinforces the surroundings of the chip and thus prevents destruction.

Microchips are conventionally embedded in chip cards on a fundamental body which itself is generally more rigid than the material in which it is to be embedded. For normal cards made of synthetic material (see ISO 7816, ISO 14 443), this mechanical carrier has the overall size of the synthetic material card and comprises both the antenna for the contactless operation and the microchip itself. The synthetic material card has a high mechanical rigidity so that the microchip is hardly bent and, consequently, does not tend to break.

In contrast, the new generations of passports or identification cards neither have a synthetic material card format (as in ISO 7816 or ISO 14 443), nor their mechanical rigidity. Even very thinly ground microchips, with stringent requirements imposed on their bending strength, would not be resistant to stress for years without further measures. The semiconductor materials such as silicon used for manufacturing microchips are very brittle and thus liable to breakage and are not very resistant to complex bending loads.

It is an object of the invention to provide an arrangement in which the RFID chip can withstand stress for years. According to the invention, this object is achieved by means of an identification document as defined in the characterizing part of claim 1. One page of this identification document is provided with at least one contactless RFID chip and an antenna connected thereto by means of bonding wires. Since an additional layer mechanically reinforcing the RFID chip is provided at the area of the RFID chip on the page, it is advantageously achieved that the basic chip material is protected from breakage.

In a preferred embodiment of the invention, the additional reinforcing layer is made of a stainless material such as stainless steel or the like. This allows years of use without a change of the mechanical condition of the layer. A layer of stainless steel-sheet (V2A) may be formed in a very thin size. Corrosion-free materials which are suitable for manufacturing the additional layer are, for example, V2A, V4A, GfK or carbon fiber. Since the mechanically reinforcing layer is made of a material having a high thermal capacity, it can also advantageously conduct heat which is generated when operating the RFID chip. This may lead to a longer lifetime of the RFID chip.

In a further preferred embodiment of the invention, the additionally reinforcing layer has a curved or serrated outer edge. It is thereby ensured that, with a uniform thickness, the rigidity of the layer gradually decreases from the middle, where the center of the chip is supported, towards its outer edge. In the case of mechanical stress, i.e. when a force acts on the outer edge of the additional layer, the page of the document is bent, with the curvature being smallest in the middle and gradually increasing towards the edge. Consequently, little stress is exerted on the chip which thus does not tend to break and is neither urged into the embedding material, which would also entail a risk of breakage.

A very simple realization of the arrangement described above is obtained in that the additional reinforcing layer is apertured. The adhesives used for connecting the two layers can pass through these apertures. This ensures a stronger adhesion of the additional reinforcing layer as well as of the externally connecting cover sheet on the fundamental body of the chip.

These and other aspects of the invention are apparent from and will be elucidated with reference to the embodiments described hereinafter.

Figure 1:
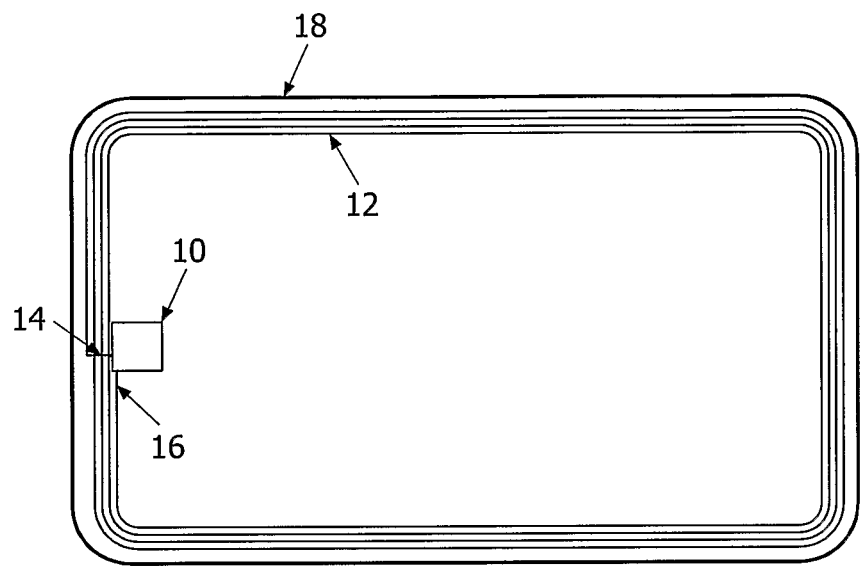
FIG. 1 shows the arrangement of an RFID chip and an antenna on a prior-art card made of synthetic material.

FIG. 1 shows the arrangement of an RFID system of the prior art. An RFID chip 10 and a lateral coil 12 operating as an antenna are interconnected by means of the bonding wires 14 and 16. The system is provided on a chip card body 18 made of a synthetic material. Since the synthetic material itself has a relatively high rigidity, the RFID chip is protected from breakage. The problem on which the invention is based is caused in that, as compared with the first-mentioned case, the carrier material has an essentially lower rigidity when an RFID chip is embedded in an identification document.

Figure 2:
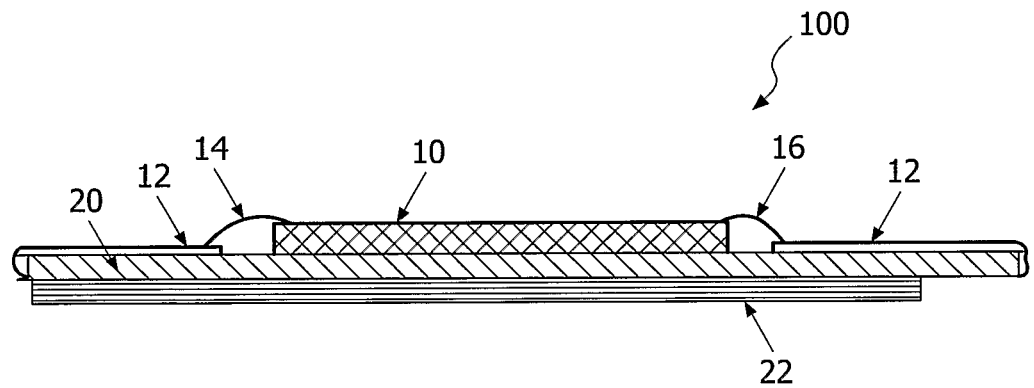
FIG. 2 shows the arrangement of an RFID chip and a layer mechanically reinforcing the RFID chip without using a bending force.

FIG. 2 shows the mechanical reinforcement of the RFID chip (shown without bending load). Again, an RFID chip 10 and an antenna 12, which are interconnected by means of the bonding wires 14 and 16, are provided on a module body 20 which is made of a synthetic material and is softer than the material used for the normal smart cards. A mechanically reinforcing layer 22 is now provided on the side of the page of the identification document facing the RFID chip. Typically, the arrangement shown in FIG. 2 is surrounded by additional protective layers at the top and bottom. Without the mechanically reinforcing layer 22, the rigidity of the module body 20 should be chosen to be essentially higher, with the risk that the consecutive layers might come off. In the event of this delamination, shearing forces would be produced on the surface of the embedded RFID chip, which forces would damage both the connections 14 and 16 to the antenna and the RFID chip 10 itself.

Figure 3:
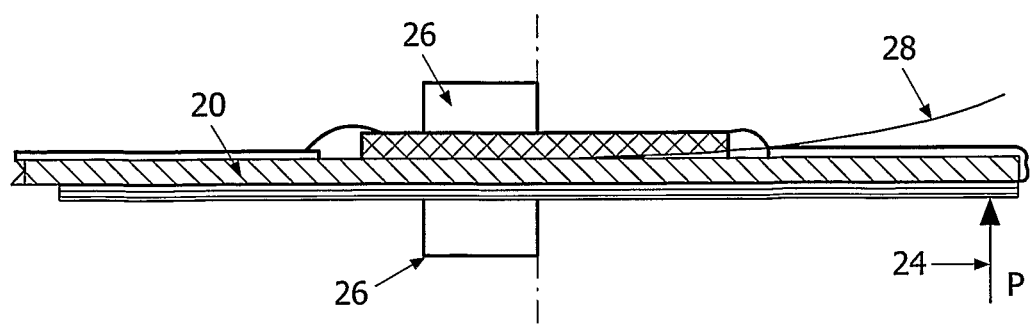
FIG. 3 shows the arrangement of an RFID chip and a layer mechanically reinforcing the RFID chip while using a bending force.

FIG. 3 shows the same arrangement while using a bending force P24. The page of the identification document, denoted overall by the reference numeral 100, is considered to be fixed at the area of the center of the RFID chip 10 by means of a holding mechanism 26. Since the rigidity of the mechanically reinforcing layer 22 continuously decreases from the center of the RFID chip 10 towards the rim of the layer 22, the bending radius gradually increases from the inner side to the outer side. Consequently, the relative deflections of the various regions are smallest at the area of the RFID chip 10. This minimizes the risk of breakage of the chip.

Figure 4:
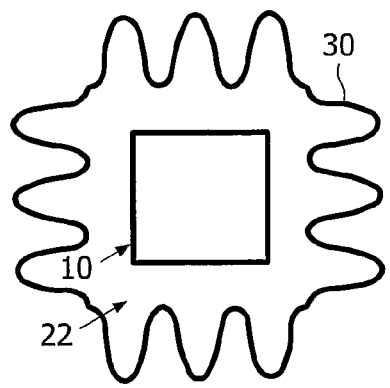
FIG. 4 shows a geometrical shape of the mechanically reinforcing layer.
Figure 5:
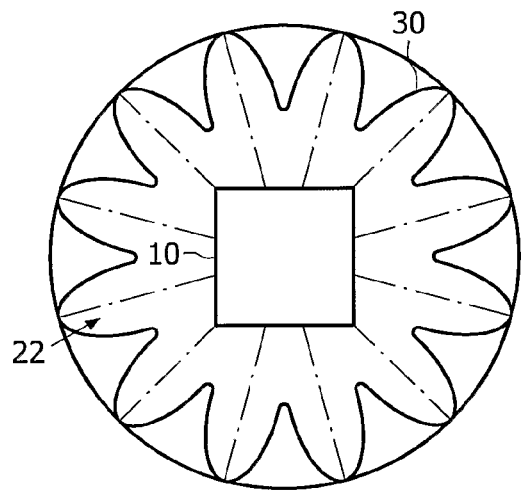
FIG. 5 shows a further geometrical shape of the mechanically reinforcing layer.

FIG. 4 shows a possible geometrical shape of the mechanically reinforcing layer 22 having an appropriate behavior. The outer edge 30 of the mechanically reinforcing layer is curved, with the rounded corners having a maximal radius of curvature so as to prevent the mechanically reinforcing layer 22 from being urged into the embedding material of the module body 20. FIG. 4 shows the fundamental shape of the reinforcing layer 22 as a rectangle. However, it may be alternatively circular, as shown in FIG. 5.

Figure 6:
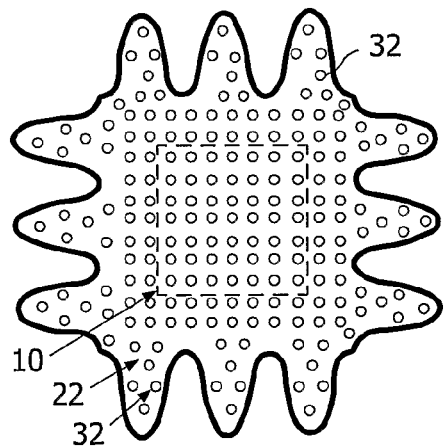
FIG. 6 shows the mechanically reinforcing layer with a large number of apertures.

FIG. 6 shows the mechanically reinforcing layer 22 with a large number of apertures 32. It is achieved by this measure that the mechanically reinforcing layer 22, which is provided by means of a suitable adhesive, adheres more rigidly to the surrounding layers, i.e. to the module body 20 and the enveloping material. The adhesive passes through the apertures 32 and connects with the neighboring material so as to prevent delamination. This arrangement minimizes the risk of a delamination having the consequences as described hereinbefore.

The invention claimed is:

1. A passport having multiple soft synthetic pages, wherein at least one contactless RFID chip and an antenna connected thereto are integrated on a soft synthetic page of the passport, characterized in that an additional rigid layer mechanically reinforcing the RFID chip is situated at the area of the RFID chip on the page and wherein the RFID chip has a rectangular perimeter that is completely within the perimeter of the additional rigid layer and wherein the perimeter of the RFID chip and the perimeter of the additional rigid layer are concentric in the plane of the soft synthetic pages and wherein the additional rigid layer mechanically reinforcing the RFID chip has a curved or serrated outer edge all the way around its perimeter, wherein the rigidity of the additional rigid layer mechanically reinforcing the RFID chip gradually decreases from its center towards its edge at a location across from each edge of the rectangular perimeter of the RFID chip, wherein the additional rigid layer mechanically reinforcing the RFID chip is provided on a first side of the page opposite to a second side of the page where the RFID chip is situated, and wherein the RFID chip, the antenna, and the additional rigid layer are surrounded by additional protective layers on both sides.

2. An identification document as claimed in claim 1, characterized in that the additional rigid layer mechanically reinforcing the RFID chip is made of a corrosion-free material such as a stainless steel-sheet.

3. An identification document as claimed in claim 1, characterized in that a large number of apertures has been punched through the additional rigid layer mechanically reinforcing the RFID chip to create holes that are completely surrounded by the additional rigid layer, and wherein adhesive passes through the apertures and connects with neighboring material.

4. A passport comprising:
multiple soft synthetic pages;
at least one of the soft synthetic pages having a first major surface and second major surface opposite the first major surface;
a contactless RFID chip and an antenna connected to the first major surface of the soft synthetic page;
a rigid mechanically reinforcing layer adhered to the second major surface of the soft synthetic page directly opposite the contactless RFID chip and wherein the RFID chip has a rectangular perimeter that is completely within the perimeter of the rigid mechanically reinforcing layer and wherein the perimeter of the RFID chip and the perimeter of the rigid mechanically reinforcing layer are concentric in the plane of the soft synthetic pages and wherein the rigid mechanically reinforcing layer has a curved or serrated outer edge all the way around its perimeter, wherein the rigidity of the rigid mechanically reinforcing layer gradually decreases from its center towards its edge at a location across from each edge of the rectangular perimeter of the RFID chip; and
wherein the soft synthetic page, the contactless RFID chip and antenna, and the rigid mechanically reinforcing layer are surrounded by additional protective layers on both sides.

5. An identification document as claimed in claim 4, characterized in that the rigid mechanically reinforcing layer has multiple apertures through the rigid mechanically reinforcing layer that create holes that are completely surrounded by the rigid mechanically reinforcing layer, and wherein adhesive passes through the apertures and connects with neighboring material.

6. A passport comprising:
multiple soft synthetic pages;
at least one of the soft synthetic pages having a first major surface and second major surface opposite the first major surface;
a contactless RFID chip and an antenna connected to the first major surface of the soft synthetic page;
a rigid mechanically reinforcing layer adhered to the second major surface of the soft synthetic page directly opposite the contactless RFID chip and wherein the RFID chip has a rectangular perimeter that is completely within the perimeter of the rigid mechanically reinforcing layer and wherein the rigid mechanically reinforcing layer has a curved or serrated outer edge all the way around its perimeter such that the rigidity of the rigid mechanically reinforcing layer gradually decreases from its center towards its edge at a location across from each edge of the rectangular perimeter of the RFID chip.

* * * * *